United States Patent
Takahashi

(10) Patent No.: US 6,930,553 B2
(45) Date of Patent: Aug. 16, 2005

(54) AUTOMATIC GAIN CONTROL DEVICE AND AUTOMATIC GAIN CONTROL METHOD

(75) Inventor: Toshihiko Takahashi, Osaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 101 days.

(21) Appl. No.: 10/436,460

(22) Filed: May 13, 2003

(65) Prior Publication Data

US 2003/0210095 A1 Nov. 13, 2003

(30) Foreign Application Priority Data

May 13, 2002 (JP) ........................................ 2002-136462

(51) Int. Cl.$^7$ ................................................ H03G 3/10
(52) U.S. Cl. ........................................ 330/279; 330/129
(58) Field of Search ................................. 330/279, 129, 330/282, 136; 455/234.1, 232.1, 245.1

(56) References Cited

U.S. PATENT DOCUMENTS 6,392,479 B2 * 5/2002 Miura .......................... 330/129
6,608,524 B2 * 8/2003 Kawabe et al. ............. 330/137
6,708,025 B2 * 3/2004 Iwata et al. ................ 455/234.1

FOREIGN PATENT DOCUMENTS

JP        04330811 A     11/1992

* cited by examiner

Primary Examiner—Henry Choe
(74) Attorney, Agent, or Firm—Steptoe & Johnson LLP

(57) ABSTRACT

An automatic gain control device comprises a variable gain amplifier (VGA) for increasing the amplitude of an input analog signal that has a plurality of CAPA having different signal characteristics; an A/D converter for sampling the output from the VGA to convert it into a digital signal; a signal discriminator for detecting the signal length of the digital signal; an amplitude information extractor for extracting amplitude information of a digital signal having a desired signal length on the basis of the detected signal length and a control gate signal supplied from the outside; an AGC controller for generating a control signal for controlling the VGA on the basis of the amplitude information; and a D/A converter for converting the control signal into an analog signal to be output to the VGA.

15 Claims, 11 Drawing Sheets

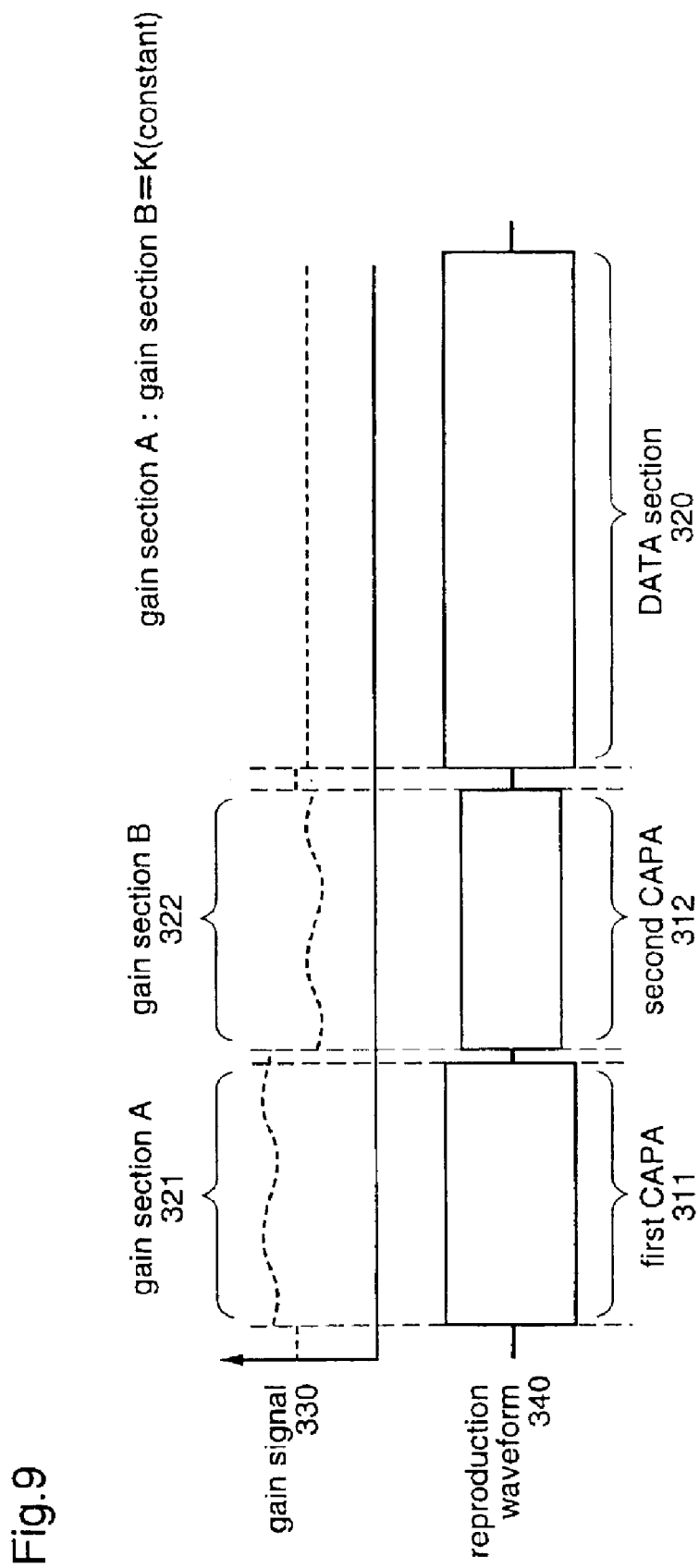

AUTOMATIC GAIN CONTROL DEVICE AND AUTOMATIC GAIN CONTROL METHOD

FIELD OF THE INVENTION

The present invention relates to an automatic gain control device and an automatic gain control method for controlling the amplitude of a signal reproduced from a storage medium such as an optical disc device.

BACKGROUND OF THE INVENTION

In recent years, optical disc devices and communication devices have been rapidly increased in capacity (speed) and reduced in size, and technologies thereof have made remarkable progress. In a conventional optical disc device, automatic gain control (hereinafter referred to as "AGC") for keeping the amplitude of an input analog signal constant is carried out as follows. That is, the input analog signal is subjected to full-wave rectification or half-wave rectification, and the rectified signal is input to a variable gain amplifier (hereinafter referred to as "VGA") to be automatically gain-controlled. Further, a storage medium having a sector format structure, such as a MO or a DVD-RAM, stores data having ID sections including information of data position (address information) and DATA sections including user data. Especially in a DVD-RAM, there exist blocks having plural pieces of address information which are called CAPA (Complementary Allocated Prepit Addresses) in the ID sections. The plural pieces of CAPA have different signal characteristics such as signal amplitudes and offsets when being reproduced.

Hereinafter, the conventional AGC control system will be described with reference to FIG. 15.

FIG. 15 is a block diagram illustrating an example of the conventional AGC control system. In FIG. 15, reference numeral 610 denotes an analog signal, 611 denotes a VGA for varying a gain on the basis of external control, 612 denotes a full-wave rectifier (FWR) for turning back the output signal from the VGA 611 at its center, and rectifying the signal to obtain amplitude information, and 613 and 614 denote low-pass filters (LPF) for removing high-frequency components from the full-wave-rectified signal. Reference numeral 630 denotes an ID gate signal which is a signal for distinguishing between the ID section and the DATA section.

Initially, the input analog signal 610 is given a gain by the VGA 611, whereby the amplitude thereof is changed. The output from the VGA 611 is full-wave-rectified by the FWR 612, whereby amplitude information is taken out.

Since the amplitude information outputted from the FWR 612 includes high-frequency components which are unnecessary for AGC control, the high-frequency components are removed by the LPF 613 and the LPF 614, and the output from the LPF is supplied to the VGA 611 as a gain control signal.

The LPF 613 and the LPF 614 are provided for performing independent AGC control for the DATA section and the ID section of the input analog signal 610, respectively, and switching therebetween is carried out by the ID gate signal 630. Because the DATA section and the ID section have considerably different signal characteristics, the respective sections are independently AGC-controlled.

As described above, in the conventional AGC control system, the ID sections are united, and the first CAPA signal and the second CAPA signal are AGC-controlled with the same gain. Therefore, the first and second CAPA signals with their signal amplitudes being varied are input to the subsequent processing system. As a result, CAPA reading accuracy is degraded, and address information reading errors occur frequently. Thus, many system retries occur at reading, resulting in a reduction in system performance. Further, since signal resolution varies considerably, address reading errors occur frequently in the conventional AGC control method which employs averaging of all signals in analog mode, resulting in a reduction in system performance.

SUMMARY OF THE INVENTION

The present invention is made to solve the above-described problems and has for its object to provide a device and a method for performing automatic gain control (AGC) for each of two CAPA signals having different signal characteristics, by utilizing the characteristics of digital signal processing, with minimizing an increase in circuit scale.

Other objects and advantages of the present invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided an automatic gain control device for automatically controlling an amplitude of an analog signal to be constant when reproducing the analog signal which has ID sections indicating plural pieces of address information having different characteristics and DATA sections indicating user information, and the automatic gain control device comprises a variable gain amplifier means for giving a predetermined gain to the analog signal to increase the amplitude of the analog signal; an A/D conversion means for sampling the output of the variable gain amplifier means to convert it into a digital signal; an amplitude information extraction means for extracting amplitude information from the signals corresponding to the plural pieces of address information in the digital signal; and an automatic gain control means for controlling the gain of the variable gain amplifier means on the basis of the respective amplitude information extracted by the amplitude information extraction means. Therefore, in contrast to performing automatic gain control for both of the ID sections and the DATA sections included in the analog signal as conventional, automatic gain control is performed for only the ID sections, and thereby the address reading rate can be increased. As a result, automatic gain control can be carried out more accurately.

According to a second aspect of the present invention, the automatic gain control device according to the first aspect further comprises a gain ratio generation means for, assuming that an ID section indicating the first address information among the plural pieces of address information included in the ID sections is a first CAPA and an ID section indicating the next address information is a second CAPA, determining a gain of the second CAPA so as to have a predetermined constant ratio to the gain of the first CAPA; and a signal selection means for selecting either the output of the amplitude information extraction means or the output of the gain ratio generation means on the basis of a control gate signal that is supplied from the outside, and outputting the selected signal to the automatic gain control means; wherein the automatic gain control means controls the gain of the variable gain amplifier means on the basis of the signal selected by the signal selection means. Therefore, continuously monitoring the gain ratio between the first CAPA and the second CAPA, automatic gain control is performed independently for the first CAPA and for the second CAPA on the basis of the gain ratio.

According to a third aspect of the present invention, the automatic gain control device according to the first aspect further comprises a second amplitude extraction means having the same construction as the first amplitude extraction means which is the above-described amplitude extraction means; a second automatic gain control means having the same construction as the first automatic gain control means which is the above-described automatic gain control means; and a signal selection means for outputting the output of the A/D conversion means to either the first amplitude information extraction means or the second amplitude extraction means on the basis of the control gate signal supplied from the outside; wherein an ID section indicating the first address information among the plural pieces of address information included in the ID section is assumed to be a first CAPA, and an ID section indicating the next address information is assumed to be a second CAPA; the first amplitude information extraction means extracts first amplitude information from the first CAPA and outputs it to the first automatic gain control means, and the first automatic gain control means controls the gain of the variable gain amplifier means on the basis of the first amplitude information; and the second amplitude information extraction means extracts second amplitude information from the second CAPA and outputs it to the second automatic gain control means, and the second automatic gain control means controls the gain of the variable gain amplifier means on the basis of the second amplitude information. Therefore, automatic gain control for the first CAPA and for the second CAPA is carried out more minutely, and thereby performance of automatic gain control can be enhanced.

According to a fourth aspect of the present invention, the automatic gain control device according to the first aspect further comprises a second amplitude extraction means having the same construction as the first amplitude extraction means which is the above-described amplitude extraction means; a first signal selection means for outputting the output of the A/D conversion means to either the first amplitude extraction means or the second amplitude extraction means on the basis of a control gate signal supplied from the outside; and a second signal selection means for selecting either the output of the first amplitude information extraction means or the output of the second amplitude information extraction means on the basis of the control gate signal supplied from the outside, and outputting the selected signal to the automatic gain control means; wherein an ID section indicating the first address information among the plural pieces of address information included in the ID section is assumed to be a first CAPA and an ID section indicating the next address information is assumed to be a second CAPA; the first amplitude information extraction means extracts first amplitude information from the first CAPA; the second amplitude information extraction means extracts second amplitude information from the second CAPA; and the automatic gain control means controls the gain of the variable gain amplifier means on the basis of the amplitude information selected by the second signal selection means. Therefore, automatic gain control for the first CAPA and for the second CAPA is carried out more minutely, and thereby performance of automatic gain control can be enhanced as well as the circuit scale can be reduced.

According to a fifth aspect of the present invention, there is provided an automatic gain control device according to the first aspect further comprises a gain setting means for setting a predetermined gain level; wherein the automatic gain control means controls the gain of the variable gain amplifier means on the basis of the output from the gain setting means. Therefore, automatic gain control is carried out on the basis of the set gain level, leading to an increase in the address reading rate, which results in reduced circuit scale and reduced costs.

According to a sixth aspect of the present invention, the automatic gain control device according to any of the first to fifth aspects further comprises a signal discrimination means for detecting the signal length of the digital signal; wherein the amplitude information extraction means extracts amplitude information from a signal of a desired signal length in the digital signal on the basis of the signal length detected by the signal discrimination means, and outputs the extracted amplitude information to the automatic gain control means. Therefore, automatic gain control is performed for a signal having a desired signal length, and thereby the address reading rate can be increased.

According to a seventh aspect of the present invention, in the automatic gain control device according to the sixth aspect, the automatic gain control means controls the gain of the variable gain amplifier means so that the amplitude of the signal having the desired signal length becomes constant. Therefore, automatic gain control is carried out so as to make the signal length constant, and thereby the address reading rate can be increased.

According to an eighth aspect of the present invention, in the automatic gain control device according to the sixth aspect, the automatic gain control means controls the gain of the variable gain amplifier means so that the amplitude of a signal having a signal length of 3T becomes constant. Therefore, automatic gain control is carried out so that the amplitude of a signal having a signal length of 3T becomes constant, and thereby the address reading rate can be increased.

According to a ninth aspect of the present invention, in the automatic gain control device according to the sixth aspect, the automatic gain control means controls the gain of the variable gain amplifier means so that the amplitude of one of signals having signal lengths of 4T or more becomes constant. Therefore, automatic gain control is carried out so that the amplitude of one of signals having signal lengths of 4T or more becomes constant, and thereby the address reading rate can be increased.

According to a tenth aspect of the present invention, in the automatic gain control device according to the sixth aspect, the automatic gain control means controls the gain of the variable gain amplifier means so that the amplitudes of signals included in one of combinations of plural signals having signal lengths of 3T or 4T, or other signal lengths become evenly constant. Therefore, automatic gain control is carried out so that the amplitudes of signals included in one of combinations of plural signals having signal lengths of 3T or 4T, or other signal lengths become evenly constant, and thereby the address reading rate can be increased.

According to an eleventh aspect of the present invention, there is provided an automatic gain control method for automatically controlling a gain of a variable gain amplifier when increasing an amplitude of a reproduction signal which has ID sections indicating plural pieces of address information having different characteristics and DATA sections indicating user information by using the variable gain amplifier, and the automatic gain control method comprises extracting amplitude information from signals corresponding to the plural pieces of address information included in the ID sections of the reproduction signal; and automatically controlling the gain of the variable gain amplifier in accordance with the characteristics of the respective amplitude information extracted. Therefore, in contrast to performing automatic gain control for both of the ID sections and the DATA sections included in the analog signal as conventional, automatic gain control is performed for only the ID sections, and thereby the address reading rate can be increased. As a result, automatic gain control can be carried out more accurately.

According to a twelfth aspect of the present invention, in the automatic gain control method according to the eleventh aspect, an ID section indicating the first address information among the plural pieces of address information included in the ID sections is assumed to be a first CAPA, and an ID section indicating the next address information is assumed to be a second CAPA, and the gain of the second CAPA is determined so as to have a predetermined constant ratio to the gain of the first CAPA; and the gain of the first CAPA and the gain of the second CAPA are switched on the basis of a control gate signal supplied from the outside, thereby automatically controlling the gain of the variable gain amplifier. Therefore, continuously monitoring the gain ratio between the first CAPA and the second CAPA, automatic gain control is performed independently for the first CAPA and for the second CAPA on the basis of the gain ratio.

According to a thirteenth aspect of the present invention, in the automatic gain control method according to the eleventh aspect, an ID section indicating the first address information among the plural pieces of address information included in the ID sections is assumed to be a first CAPA, and an ID section indicating the next address information is assumed to be a second CAPA; and either a first automatic gain control for controlling the gain of the variable gain amplifier by extracting first amplitude information from the first CAPA or a second automatic gain control for controlling the gain of the variable gain amplifier by extracting second amplitude information from the second CAPA is carried out on the basis of a control gate signal supplied from the outside. Therefore, automatic gain control for the first CAPA and for the second CAPA is carried out more minutely, and thereby performance of automatic gain control can be enhanced.

According to a fourteenth aspect of the present invention, in the automatic gain control method according to the eleventh aspect, a predetermined gain level is set, and the gain of the variable gain amplifier is automatically controlled on the basis of the set gain. Therefore, automatic gain control is carried out on the basis of the set gain level, and thereby the address reading rate can be increased.

According to a fifteenth aspect of the present invention, in the automatic gain control method according to any of the eleventh to fourteenth aspects, a signal length of the reproduction signal is detected; and amplitude information of a signal having a desired signal length is extracted from the reproduction signal on the basis of the detected signal length, thereby automatically controlling the gain of the variable gain amplifier. Therefore, automatic gain control is performed for a signal having a desired signal length, and thereby a signal length to be controlled can be selected so that the error rate in reading the address information is minimized.

BRIEF DESCRIPTION OF THE DRAWINGS

FIG. 9 is a schematic diagram illustrating a reproduction waveform according to the embodiments of the present invention.

DETAILED DESCRIPTION OF THE PREFERRED EMBODIMENTS

[Embodiment 1]

Hereinafter, an automatic gain control device and an automatic gain control method according to a first embodiment of the present invention will be described with reference to FIGS. 1, 6, 7, and 8.

Figure 1:
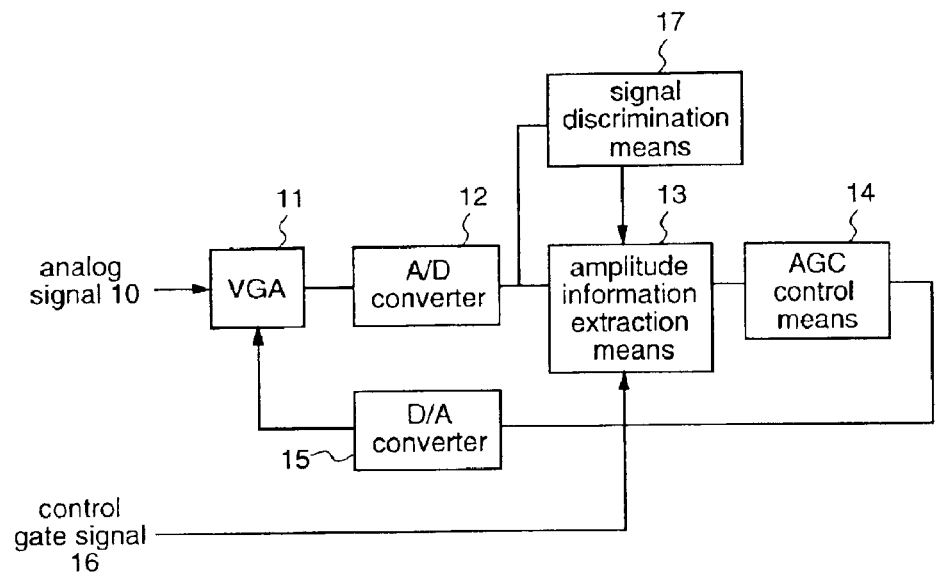
FIG. 1 is a block diagram illustrating the construction of an automatic gain control device according to a first embodiment of the present invention.

FIG. 1 is a block diagram illustrating the construction of the automatic gain control device according to the first embodiment.

In FIG. 1, reference numeral 10 denotes an analog signal reproduced from a storage medium, and this analog signal 10 has ID sections indicating plural pieces of address information having different characteristics, and DATA sections indicating user information. Reference numeral 11 denotes a VGA (Variable Gain Amplifier) for amplifying the amplitude of the analog signal 10 with gains according to the respective characteristics of the plural pieces of address information included in the ID sections. Reference numeral 12 denotes an A/D converter for converting the output signal from the VGA 11, which is an analog signal, into a digital signal by sampling the analog signal. Reference numeral 13 denotes an amplitude information extraction means for extracting amplitude information from the output signal of the VGA 11 (reproduced signal) which has been converted into a digital signal. Reference numeral 14 denotes an AGC control means for outputting a control signal which controls the VGA 11 on the basis of the amplitude information extracted by the amplitude information extraction means 13. Reference numeral 15 denotes a D/A converter for converting the output signal (control signal) from the AGC control means 14, which is a digital signal, into an analog signal. Reference numeral 16 denotes a control gate signal for distinguishing between a first CAPA and a second CAPA. Reference numeral 17 denotes a signal discrimination means for discriminating the signal lengths (e.g., 3T to 14T).

Figure 11:
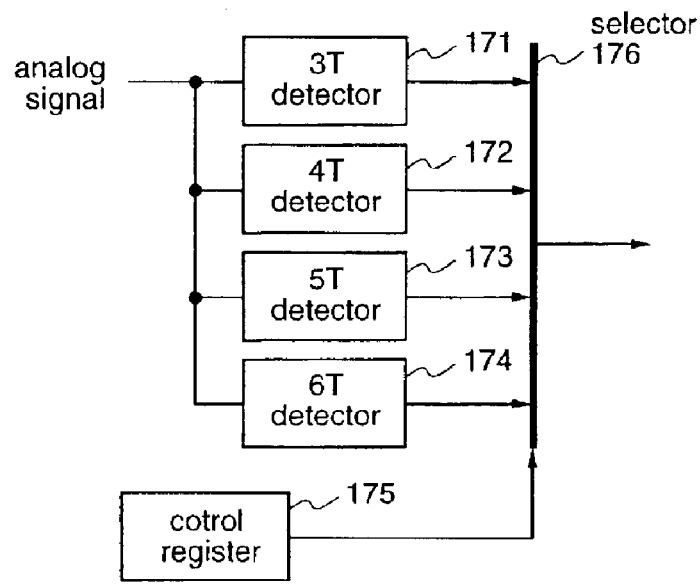
FIG. 11 is a diagram illustrating an example of a signal discrimination means according to the present invention.

FIG. 11 is a diagram illustrating an example of the signal discrimination means 17.

The signal discrimination means 17 shown in FIG. 11 is provided with detectors 171~174 for detecting the signal lengths 3T~6T of the input analog signal, and a control register 175 for selecting one of the outputs from the respective detectors 171~174 by using a selector 176 to output the selected signal to the outside (amplitude information extraction means 13). The signal discrimination means 17 can select an arbitrary signal length from among 3T~6T and adjust the amplitude of the signal having the selected signal length. While the signal discrimination means 17 is provided with the detectors 171~174 for detecting the signal lengths 3T~6T, it may be provided with detectors for detecting the signal lengths 3T~14T.

Figure 12:
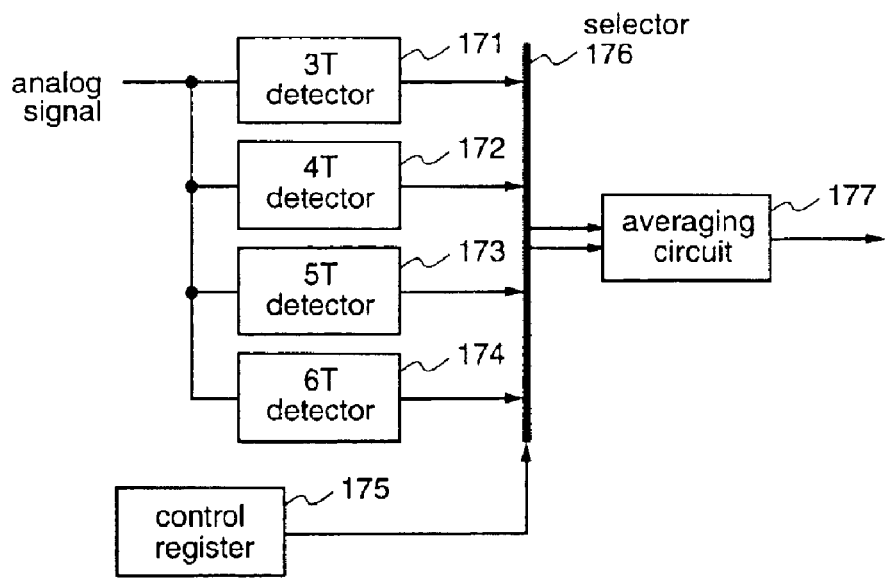
FIG. 12 is a diagram illustrating another example of a signal discrimination means according to the present invention.

FIG. 12 is a diagram illustrating another example of the signal discrimination means 17.

The signal discrimination means 17 shown in FIG. 12 is provided with detectors 171~174 for detecting the signal lengths 3T~6T of the input analog signal, a control register 175 for selecting two of the outputs from the respective detectors 171~174 by using a selector 176, and an averaging circuit 177 for averaging the selected two signal lengths. The signal discrimination means 17 can adjust the amplitude of the signal having the signal length which is obtained by averaging arbitrary two signal lengths selected from among 3T~6T. Although the control register 175 selects arbitrary two signal lengths from among the outputs of the detectors, it may select three or more signal lengths.

Figure 13:
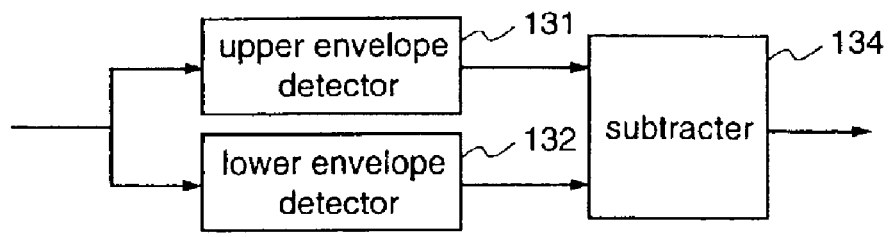
FIG. 13 is a diagram illustrating an example of an amplitude information extraction means according to the present invention.

FIG. 13 is a diagram illustrating an example of the amplitude information extraction means 13.

The amplitude information extraction means 13 shown in FIG. 13 is provided with an upper envelope detector 131 for detecting an upper envelope of the input signal (the output from the signal discrimination means 17), a lower envelope detector 132 for detecting a lower envelope of the input signal, and a subtracter 134 for calculating a difference between the detected upper envelope and lower envelope to obtain an amplitude.

Figure 14:
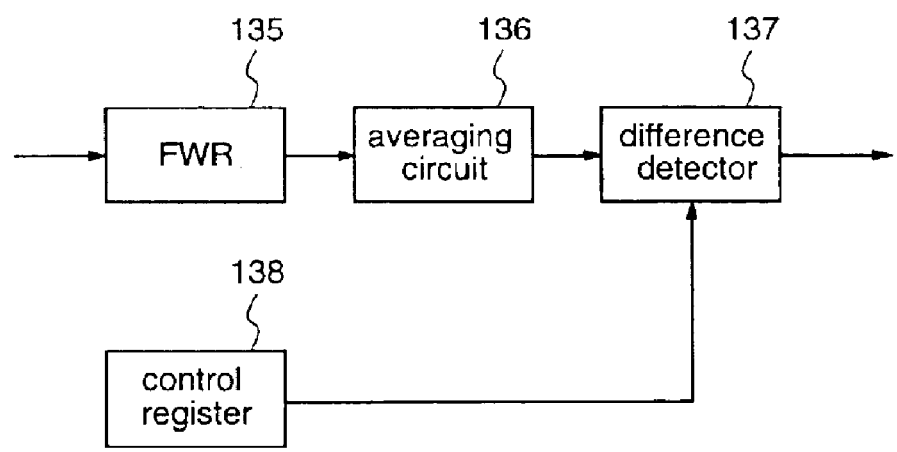
FIG. 14 is a diagram illustrating another example of an amplitude information extraction means according to the present invention.
Figure 15:
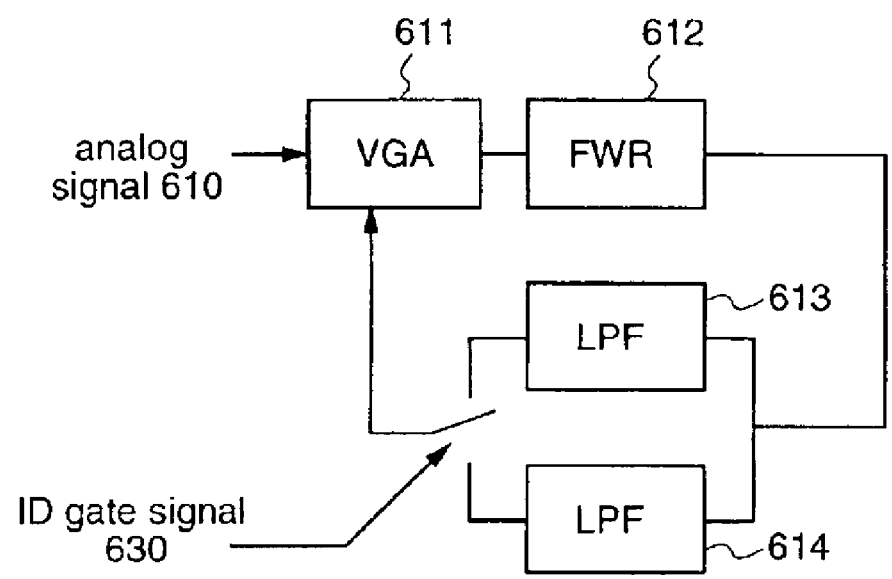
FIG. 15 is a block diagram illustrating the construction of the conventional automatic gain control device.

FIG. 14 is a diagram illustrating another example of the amplitude information extraction means 13.

The amplitude information extraction means 13 shown in FIG. 14 is provided with a full-wave rectifier (FWR) 135 for rectifying the input signal (the output from the signal discrimination means 17) to extract amplitude information, an averaging circuit 136 for averaging the extracted amplitude information, and a difference detector 137 for detecting a difference between the output from the averaging circuit 136 and a target value that is set by the control register 138.

Hereinafter, a signal reproduced from an optical disc (the input analog signal 10) will be described.

The amplitude of a signal reproduced from an optical disc varies according to MTF (Mode Transfer Function) which is an optical frequency response, when the signal is output from an optical pickup. That is, a 3T component of the highest frequency has the smallest signal amplitude, and the signal amplitude becomes larger as the frequency is lowered like 4T, 5T, 6T (as the cycle is increased), and the amplitude reaches almost maximum when the frequency exceeds 7T.

Figures 10A, 10B:
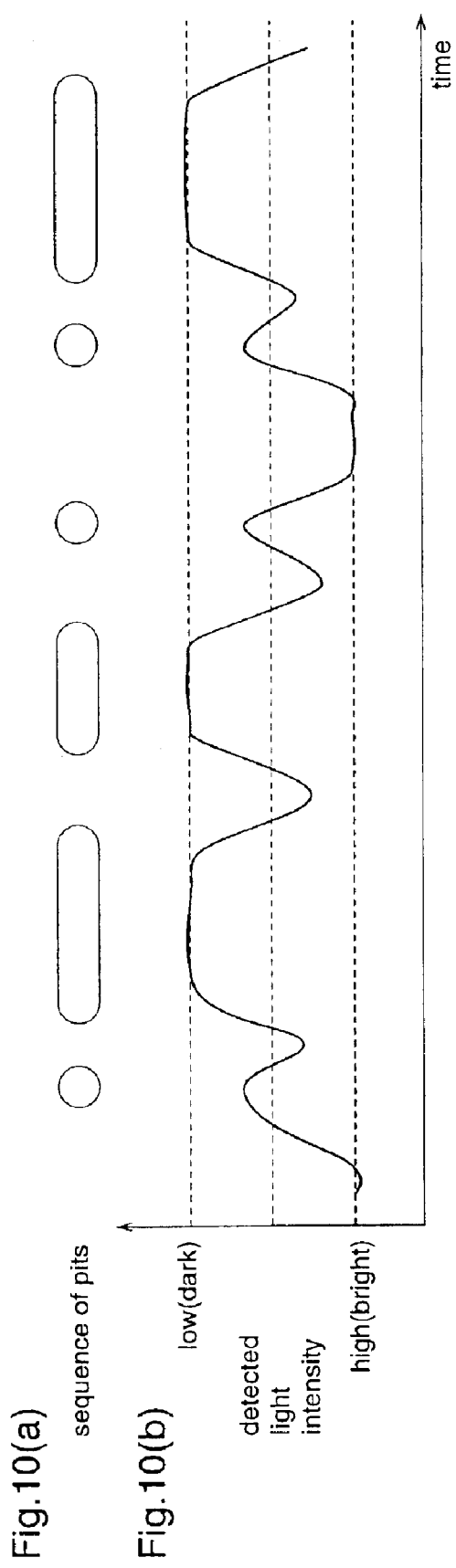
FIGS. 10($a$) and 10($b$) are diagrams illustrating the relationship between a sequence of pits and a detected light intensity.

A description will be given of the case where pits are formed on the recording layer of the optical disc as shown in FIG. 10(a). When such a sequence of pits is irradiated with a light beam and the reflected light beam is received with a photodetector (not shown), a detected light intensity as shown in FIG. 10(b) is obtained. At this time, if a light beam much larger than a pit is applied or a light beam is applied over two pits, inter-symbol interference occurs, and thereby the signal amplitude becomes smaller, resulting in degraded accuracy in reading the address information.

In order to solve the above-described problem, the signal discrimination means 17 selectively discriminates the components of relatively small signal amplitudes, i.e., the signals having relatively high frequencies, such as 3T and 4T, and the amplitude information detection means 13 selects only a specific frequency component from among the discriminated signals. Then, the AGC control means 14 performs automatic gain control so as to make the amplitude level constant. In this way, only a frequency component of a small signal amplitude is extracted to be AGC-controlled, whereby the address information reading accuracy is increased.

The AGC control means 14 controls the VGA 11 so that the amplitude of the signal having the signal length of 3T becomes constant. Alternatively, the AGC means 14 may control the VGA 11 so that the amplitude of a signal among plural signals having the signal lengths of 4T or longer becomes constant. Furthermore, the AGC means 14 may control the VGA 11 so that the amplitudes of signals included in one of combinations of plural signals having the signal lengths of 3T, 4T, or other lengths become evenly constant.

Figure 6:
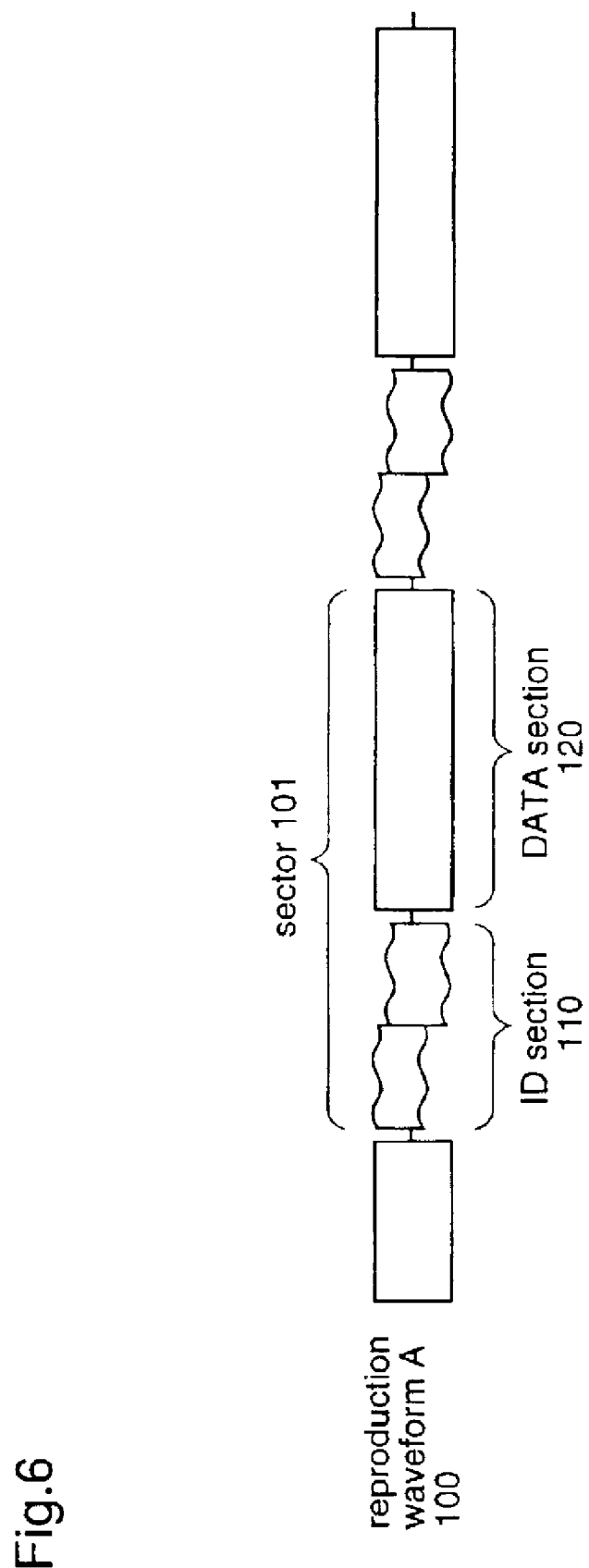
FIG. 6 is a schematic diagram illustrating a reproduction waveform of an analog signal.

FIG. 6 is a schematic diagram illustrating a waveform of the analog signal 10.

In FIG. 6, reference numeral 100 denotes a schematic reproduction waveform A of the analog signal 10, 101 denotes a sector indicating one section of the signal reproduced from the storage medium having a sector format structure, 110 denotes an ID section indicating address information (information of data position) in the sector 101, and 120 denotes a DATA section indicating user information.

Figure 7:
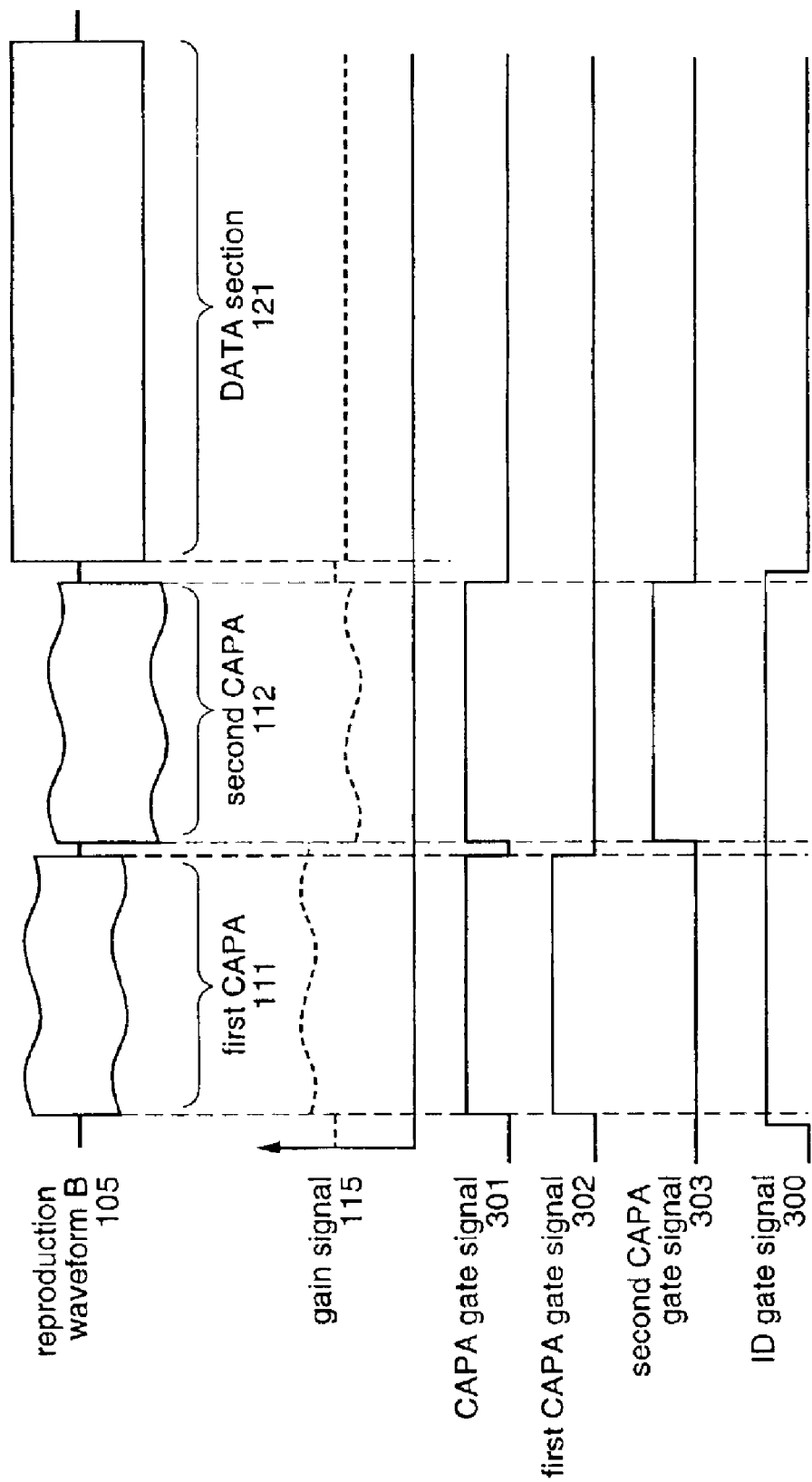
FIG. 7 is a diagram for explaining AGC control for an analog signal.

FIG. 7 is a schematic diagram illustrating a waveform of the analog signal 10 which is supplied from the outside.

In FIG. 7, reference numeral 105 denotes a schematic reproduction waveform B of the analog signal 10, 111 denotes a first CAPA indicating first address information, 112 denotes a second CAPA indicating second address information, 121 denotes a DATA section indicating user information, 115 denotes a gain signal indicating the output of the AGC means 14, 301 denotes a CAPA gate signal for distinguishing between the first CAPA 111 and the second CAPA 112, 302 denotes a first CAPA gate signal for detecting only the first CAPA 111, 303 denotes a second CAPA gate signal for detecting only the second CAPA 112, and 300 denotes an ID gate signal for distinguishing between the ID section and the DATA section.

As for the control gate signal 16, either the first CAPA gate signal 302 or the second CAPA gate signal 303 may be used as the control gate signal 16. Alternatively, an AND or an exclusive OR obtained between the ID gate signal 300 and one of the first CAPA gate signal 302 and the second CAPA gate signal 112 may be used as the control gate signal 16. Furthermore, after the device enters into the state where the address information can be accurately reproduced, a format generation circuit (not shown) may generate the first CAPA gate signal 302 or the second CAPA gate signal 303 in the position of target address information (target CAPA)

to be reproduced, while operating a counter (not shown) starting from a CAPA gate signal that is positioned one or plural CAPA before the target CAPA, and the CAPA gate signal so generated may be used as the control gate signal 16.

Figure 8:
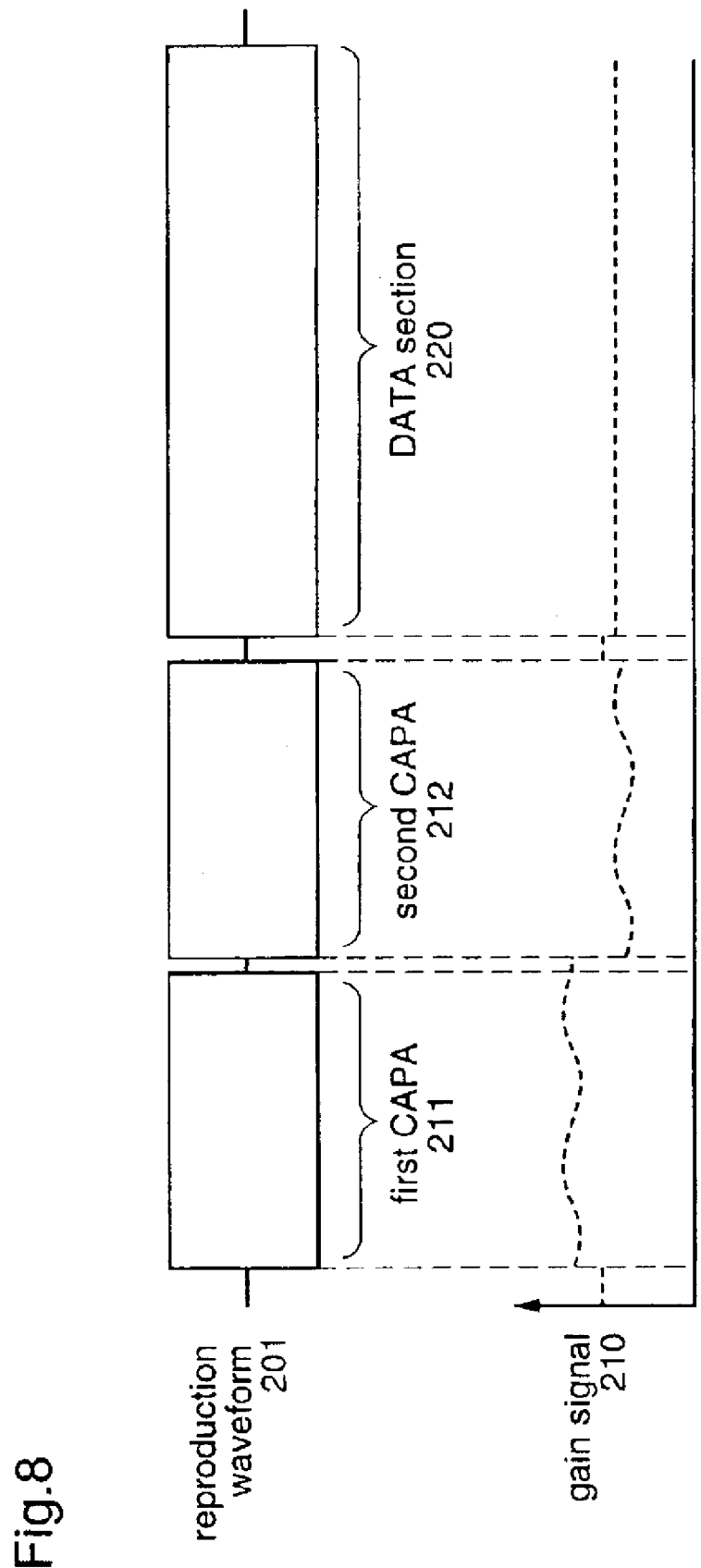
FIG. 8 is a schematic diagram illustrating a reproduction waveform of an AGC-controlled analog signal.

FIG. 8 is a schematic diagram illustrating a waveform of the AGC-controlled analog signal 10.

In FIG. 8, reference numeral 201 denotes a reproduction waveform of the AGC-controlled signal outputted from the VGA 11, and 210 denotes a gain signal to be a control signal for the VGA 11.

Hereinafter, the operation of the automatic gain control device constructed as described above will be described.

The analog signal 10 is in the form of the reproduction waveform A 100 (reproduction waveform B 105) shown in FIG. 6 (7), and it is input to the VGA 11. At this time, in the reproduction waveform B 105 shown in FIG. 7, the first CAPA 111 and the second CAPA 112 have different amplitudes and are nonuniform.

The analog signal whose amplitude is increased by the VGA 11 is converted into a digital signal by the A/D converter 12. Then, the signal discrimination means 17 discriminates information relating to the signal length from the output of the A/D converter 12. At this time, the signal discrimination means 17 discriminates the signal length by counting the signal interval with a channel clock (1T, 2T, 3T, . . . ).

Then, the amplitude information extraction means 13 extracts, from the output of the A/D converter 12, amplitude information of a signal having a specific signal length (e.g., 3T or 6T) on the basis of the amplitude information of the analog signal 10 and the signal length information discriminated by the signal discrimination means 17, and the extracted amplitude information is supplied to the AGC control means 14.

Then, the AGC control means 14 controls the gain on the basis of the amplitude information outputted from the amplitude information extraction means 13, and the amount of control is converted into a gain signal 115 as an analog signal by the D/A converter 15, and the VGA 11 is controlled by the gain signal 115. As a result, the input analog signal 10 having the reproduction waveform B 105 in which the amplitudes of the first CAPA 111 and the second CAPA 112 are not uniform is controlled so as to have the reproduction waveform 201 shown in FIG. 8 in which the amplitudes of the first CAPA 211 and the second CAPA 212 are uniform.

As described above, according to the first embodiment of the invention, after increasing the amplitude of the input analog signal 10 having the ID sections indicating plural pieces of address information and the DATA sections indicating user information, the signal 10 is digitized, and plural pieces of amplitude information are extracted from the signals corresponding to the plural pieces of address information included in the ID sections in the digitized signal, and the gain of the VGA 11 is controlled on the basis of the respective amplitude information extracted. Therefore, automatic gain control can be performed for only the ID sections in accordance with the respective characteristics of the plural pieces of address information included in the ID sections. As a result, the automatic gain control can be carried out with higher accuracy, and the error rate in reading the address information can be reduced, thereby realizing a stable system constitution.

Further, since the automatic gain control device according to the first embodiment is provided with the signal discrimination means 17 for detecting the signal length of the digital signal, automatic gain control can be performed for only a signal having a desired signal length. As a result, the address reading rate can be increased.

[Embodiment 2]

Hereinafter, an automatic gain control device and an automatic gain control method according to a second embodiment of the present invention will be described with reference to FIGS. 2, 6, 7, and 9. Since FIGS. 6 and 7 have already been described for the first embodiment, repeated description is not necessary.

Figure 2:
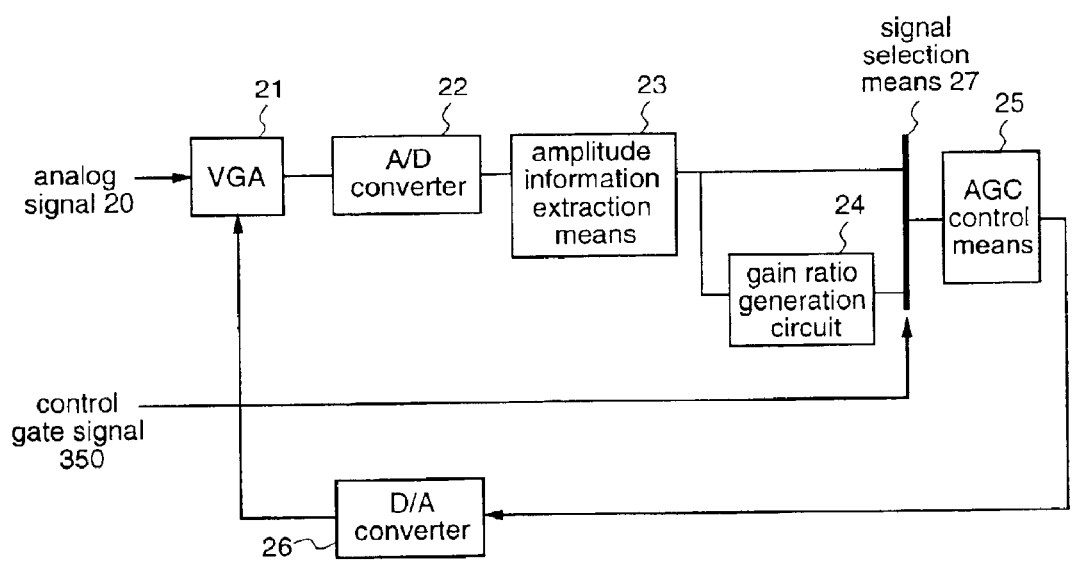
FIG. 2 is a block diagram illustrating the construction of an automatic gain control device according to a second embodiment of the present invention.

FIG. 2 is a block diagram illustrating the construction of the automatic gain control device according to the second embodiment.

In FIG. 2, reference numeral 20 denotes an analog signal reproduced from a storage medium, and this analog signal 20 has ID sections indicating plural pieces of address information having different characteristics, and DATA sections indicating user information. Reference numeral 21 denotes a VGA (Variable Gain Amplifier) for increasing the amplitude of the analog signal 20 with gains according to the respective characteristics of the plural pieces of address information included in the ID sections. Reference numeral 22 denotes an A/D converter for converting the output from the VGA 21, which is an analog signal, into a digital signal by sampling the analog signal. Reference numeral 23 denotes an amplitude information extraction means for extracting first amplitude information from the output of the A/D converter 22 (reproduced signal). Reference numeral 24 denotes a gain ratio generation circuit for generating second amplitude information having a constant ratio to the first amplitude information outputted from the amplitude information extraction means 23. Reference numeral 25 denotes an AGC control means for outputting a control signal for controlling the VGA 21 on the basis of the amplitude information extracted by the amplitude information extraction means 23. Reference numeral 26 denotes a D/A converter for converting the output from the AGC control means 25 (control signal), which is a digital signal, into an analog signal. Reference numeral 27 denotes a signal selection means for selecting either the output of the amplitude information extraction means or the output of the gain ratio generation circuit 24 on the basis of a control gate signal 350 that is supplied from the outside. The control gate signal 350 discriminates between a first CAPA and a second CAPA. The control gate signal 350 is generated in the same manner as the control gate signal of the first embodiment.

FIG. 9 is a schematic diagram illustrating the waveform of the analog signal 20.

In FIG. 9, reference numeral 330 denotes a gain signal to be input to the VGA 21, 321 denotes a gain section A, and 322 denotes a gain section B. The gain ratio between the gain section A and the gain section B is constant. Reference numeral 340 denotes a reproduction waveform of the AGC-controlled output from the VGA 21, 311 denotes the first CAPA of the AGC-controlled reproduction waveform 340, 312 denotes the second CAPA of the AGC-controlled reproduction waveform 340, and 320 denotes a DATA section of the AGC-controlled reproduction waveform 340.

Hereinafter, a description will be given of the operation of the automatic gain control device constituted as described above.

The analog signal 20 is in a form of the reproduction waveform A 100 (reproduction waveform B 105) shown in FIG. 6 (FIG. 7), and it is input to the VGA 21. At this time, in the reproduction waveform B 105 shown in FIG. 7, the amplitudes of the first CAPA 111 and the second CAPA 112 are different from each other, and are nonuniform.

The analog signal whose amplitude is increased by the VGA 21 is converted into a digital signal by the A/D converter 22. Then, the amplitude information extraction means 23 extracts the first amplitude information of the input analog signal 20 from the output of the A/D converter 22, and the gain ratio generation circuit 24 generates the second amplitude information having a constant ratio to the extracted first amplitude information signal. The signal selection means 27 performs switching between these two pieces of amplitude information on the basis of the signal from the control gate signal 350 so that the two pieces of amplitude information correspond to the first CAPA 111 and the second CAPA 112 in the reproduction waveform B105, respectively, and the selected amplitude information is supplied to the AGC control means 25.

The AGC control means 25 controls the gain of the AGC on the basis of the amplitude information selected by the signal selection means 27, and the amount of control is converted into a gain signal 330 as an analog signal by the D/A converter 26, and the VGA 21 is controlled with this gain signal 330. As a result, the input analog signal 20 having the reproduction waveform B 105 in which the first CAPA 111 and the second CAPA 112 are not uniform is controlled so as to have the reproduction waveform 340 shown in FIG. 9 in which the first CAPA 311 and the second CAPA 312 are uniform, or a difference in amplitudes between them is reduced.

According to the second embodiment of the present invention, after increasing the amplitude of the input analog signal 20 having the ID sections indicating the plural pieces of address information and the DATA sections indicating the user information, the analog signal is digitized, and plural pieces of amplitude information are extracted from the signals corresponding to the plural pieces of address information included in the ID sections of the digitized signal, and thereafter, the gain of the VGA 21 is controlled on the basis of the respective amplitude information extracted. Therefore, automatic gain control can be performed for only the ID sections in accordance with the respective characteristics of the plural pieces of address information included in the ID sections. As a result, the automatic gain control can be carried out more accurately, and the error rate in reading the address information can be reduced, thereby realizing a stable system constitution.

Furthermore, in this second embodiment, the gain ratio between the gain section A 321 and the gain section B 322 is set so as to be the same as the ratio between the first CAPA 111 and the second CAPA 112. Therefore, the gain ratio between the first CAPA and the second CAPA is continuously monitored, and the first CAPA and the second CAPA can be independently AGC-controlled on the basis of the gain ratio.

[Embodiment 3]

Hereinafter, an automatic gain control device and an automatic gain control method according to a third embodiment of the present invention will be described with reference to FIGS. 3, 7, and 8. Since FIGS. 7 and 8 have already been described for the first embodiment, repeated description is not necessary.

Figure 3:
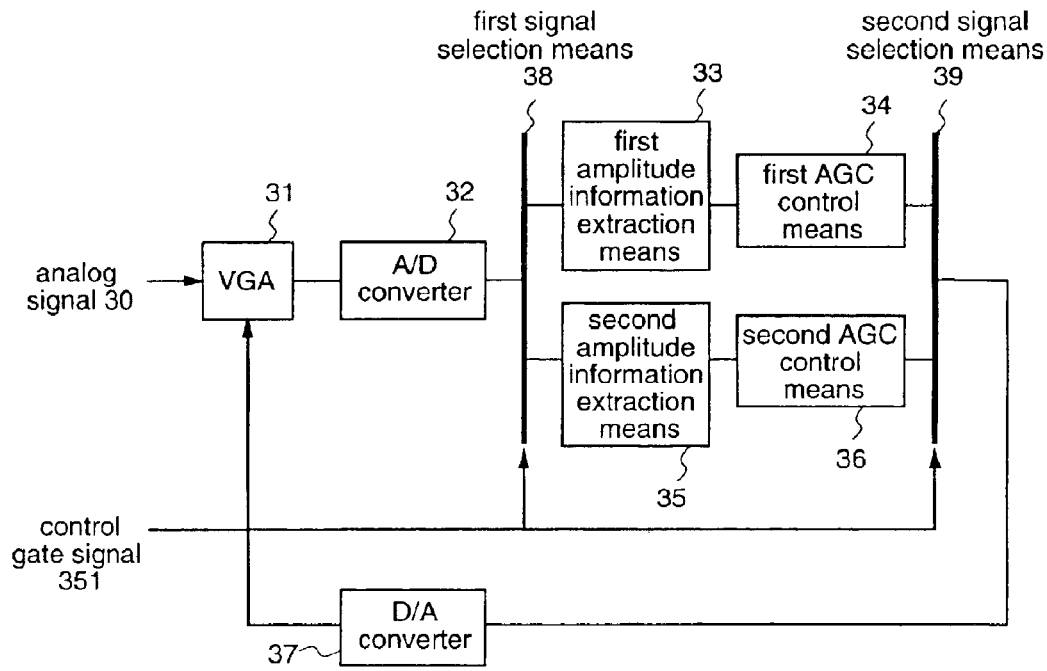
FIG. 3 is a block diagram illustrating the construction of an automatic gain control device according to a third embodiment of the present invention.

FIG. 3 is a block diagram illustrating the construction of the automatic gain control device according to the third embodiment.

In FIG. 3, reference numeral 30 denotes an analog signal reproduced from a storage medium, and this analog signal 30 has ID sections indicating plural pieces of address information having different characteristics, and DATA sections indicating user information. Reference numeral 31 denotes a VGA (Variable Gain Amplifier) for increasing the amplitude of the analog signal 30 with gains according to the respective characteristics of the plural pieces of address information included in the ID sections. Reference numeral 32 denotes an A/D converter for converting the output from the VGA 31, which is an analog signal, into a digital signal by sampling the analog signal. Reference numeral 33 denotes a first amplitude information extraction means for extracting first amplitude information from the reproduced signal that has been converted into the digital signal (the output of the A/D converter 32). Reference numeral 34 denotes a first AGC control means for controlling the amplitude of the input analog signal 30 on the basis of the first amplitude information extracted by the first amplitude information extraction means 33. Reference numeral 35 denotes a second amplitude information extraction means for extracting second amplitude information from the reproduced signal that has been converted into the digital signal (the output from the A/D converter 32). Reference numeral 36 denotes a second AGC control means for controlling the amplitude of the input analog signal 30 on the basis of the second amplitude information extracted by the second amplitude information extraction means 35. Reference numeral 37 denotes a D/A converter for converting the digital signal outputted from the first AGC means 34 or the second AGC means 36 into an analog signal. Reference numeral 38 denotes a first signal selection means for selecting either a path for outputting the signal outputted from the A/D converter 32 to the first amplitude information extraction means 33 or a path for outputting the signal from the A/D converter 32 to the second amplitude information extraction means 35, on the basis of the control gate signal 351. The path for outputting the signal from the A/D converter 32 to the first amplitude information extraction means 33 is a first CAPA control path for AGC-controlling the first CAPA 111. Further, the path for outputting the signal from the A/D converter 32 to the second amplitude information extraction means 35 is a second CAPA control path for AGC-controlling the second CAPA 112. Reference numeral 39 denotes a second signal selection means for selecting either the output of the first AGC control means 34 or the output of the second AGC control means 36 on the basis of the control gate signal 351, and outputting the selected signal to the D/A converter 37. The control gate signal 351 discriminates between the first CAPA and the second CAPA. The control gate signal 351 is generated in the same manner as the control gate signal of the first embodiment.

Hereinafter, a description will be given of the operation of the automatic gain control device constructed as described above.

The analog signal 30 is in a form of the reproduction waveform B 105 shown in FIG. 7, and it is input to the VGA 31. At this time, in the reproduction waveform B 105 shown in FIG. 7, the amplitudes of the first CAPA 111 and the second CAPA 112 are different from each other, and are nonuniform.

The analog signal whose amplitude is increased by the VGA 31 is converted into a digital signal by the A/D converter 32. Then, the signal converted into the digital signal by the A/D converter 32 is output to the control path selected by the first signal selection means 38, whereby an AGC control signal for the first CAPA 111 or an AGC control signal for the second CAPA 112 is generated.

The first CAPA 111 and the second CAPA 112 are usually output as shown by a CAPA gate signal 301 under the state where an ID gate signal 300 is asserted. Further, the control gate signal 351 separates the CAPA gate signal 301 into a first CAPA gate signal 302 and a second CAPA gate signal 303, and controls the first signal selection means 38 and the second signal selection means 39 so as to select the first CAPA 111 control path and the second CAPA 112 control path by the first CAPA gate signal 302 and the second CAPA gate signal 303, respectively.

In the control path selected by the control gate signal 351, initially, the amplitude information of the analog signal 30 is extracted from the output of the A/D converter 32 by the first amplitude information extraction means 33 or the second amplitude information extraction means 35, and the extracted amplitude information is input to the first AGC control means 34 or the second AGC control means 36, respectively, thereby generating an AGC control signal. The output from the first AGC control means 34 or the second AGC control means 36 is selected by the second signal selection means 39, and it is output to the D/A converter 37 as an AGC control signal corresponding to the first CAPA 111 and the second CAPA 112.

In the D/A converter 37, the AGC control signal selected by the control gate signal 351 is converted into a gain signal 210 which is an analog signal, and the VGA 31 is controlled by the gain signal 210. As a result, the input analog signal 30 having the reproduction waveform B 105 in which the amplitudes of the first CAPA 111 and the second CAPA 112 are not uniform is controlled so as to have the reproduction waveform 201 shown in FIG. 8 in which the amplitudes of the first CAPA 211 and the second CAPA 212 are uniform.

According to the third embodiment of the present invention, after increasing the amplitude of the input analog signal 30 having the ID sections indicating the plural pieces of address information and the DATA sections indicating the user information, the analog signal is digitized, and plural pieces of amplitude information are extracted from the signals corresponding to the plural pieces of address information included in the ID sections in the digitized signal, and thereafter, the gain of the VGA 31 is controlled on the basis of the respective amplitude information extracted. Therefore, automatic gain control can be performed for only the ID sections in accordance with the respective characteristics of the plural pieces of address information included in the ID sections. As a result, the automatic gain control can be carried out more accurately, and the error rate in reading the address information can be reduced, thereby realizing a stable system constitution.

Furthermore, in this third embodiment, the gain control for the VGA is carried out in accordance with the respective gains of the first CAPA 111 and the second CAPA 112 in the ID section 110 of the input signal 30, whereby the automatic gain control for the first CAPA and for the second CAPA can be carried out more minutely. As a result, performance of automatic gain control can be enhanced, and the address reading rate can be increased.

[Embodiment 4]

Hereinafter, an automatic gain control device and an automatic gain control method according to a fourth embodiment of the present invention will be described with reference to FIGS. 4, 7, and 8. Since FIGS. 7 and 8 have already been described for the first embodiment, repeated description is not necessary.

Figure 4:
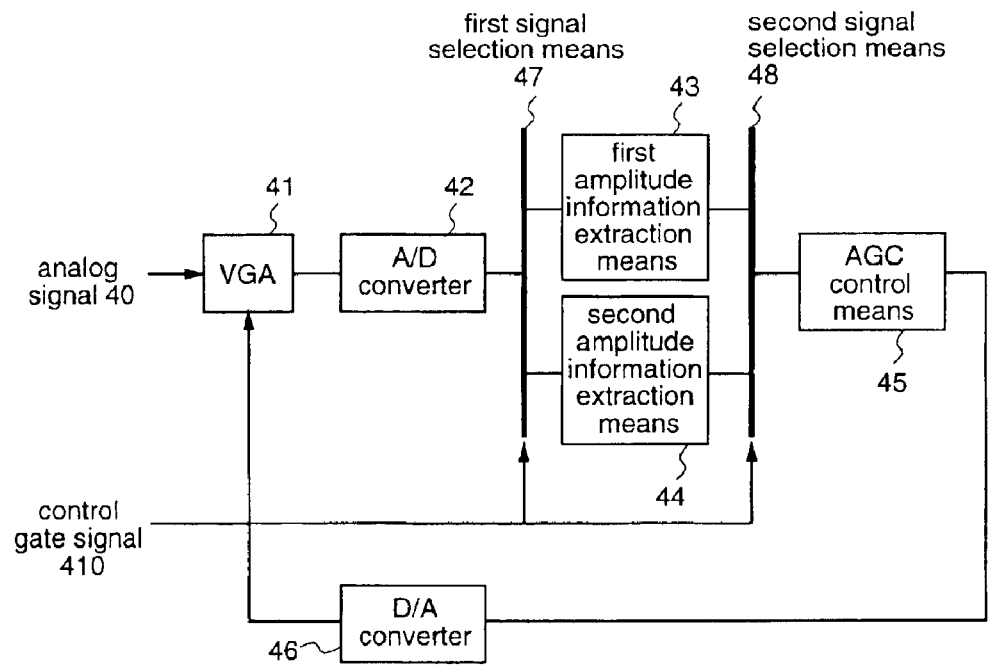
FIG. 4 is a block diagram illustrating the construction of an automatic gain control device according to a fourth embodiment of the present invention.

FIG. 4 is a block diagram illustrating the construction of the automatic gain control device according to the fourth embodiment.

In FIG. 4, reference numeral 40 denotes an analog signal reproduced from a storage medium, and this analog signal 40 has ID sections indicating plural pieces of address information having different characteristics, and DATA sections indicating user information. Reference numeral 41 denotes a VGA (Variable Gain Amplifier) for increasing the amplitude of the analog signal 40 with gains suited to the respective characteristics of the plural pieces of address information included in the ID sections. Reference numeral 42 denotes an A/D converter for converting the output from the VGA 41, which is an analog signal, into a digital signal by sampling the analog signal. Reference numeral 43 denotes a first amplitude information extraction means for extracting first amplitude information from the reproduction (the output of the A/D converter 42) which is a digital signal. Reference numeral 44 denotes a second amplitude information extraction means for extracting second amplitude information from the reproduced signal (the output of the A/D converter 42). Reference numeral 45 denotes an AGC control means for controlling the amplitude of the input analog signal 40 on the basis of the amplitude information extracted by the first amplitude information extraction means 43 or the second amplitude information extraction means 44. Reference numeral 46 denotes a D/A converter for converting the output of the AGC control means 45, which is a digital signal, into an analog signal. Reference numeral 47 denotes a first signal selection means for selecting either a path for outputting the signal outputted from the A/D converter 42 to the first amplitude information extraction means 43 or a path for outputting the signal from the A/D converter 42 to the second amplitude information extraction means 44, on the basis of the control gate signal 410. The path for outputting the signal from the A/D converter 42 to the first amplitude information extraction means 43 is a first CAPA control path for AGC-controlling the first CAPA 111. Further, the path for outputting the signal from the A/D converter 42 to the second amplitude information extraction means 44 is a second CAPA control path for AGC-controlling the second CAPA 112. Reference numeral 48 denotes a second signal selection means for selecting either the output of the first amplitude information extraction means 43 or the output of the second amplitude information extraction means 44 on the basis of the control gate signal 410, and outputting the selected signal to the AGC means 45. The control gate signal 410 discriminates between the first CAPA and the second CAPA. Further, the control gate signal 410 is generated in the same manner as the control gate signal of the first embodiment.

Hereinafter, a description will be given of the operation of the automatic gain control device constructed as described above.

The analog signal 40 is in a form of the reproduction waveform B 105 shown in FIG. 7, and it is input to the VGA 41. At this time, in the reproduction waveform B 105 shown in FIG. 7, the amplitudes of the first CAPA 111 and the second CAPA 112 are different from each other, and are nonuniform.

The analog signal whose amplitude is increased by the VGA 41 is converted into a digital signal by the A/D converter 42. Then, the digital signal is output to the control path selected by the first signal selection means 47, and an AGC control signal for the first CAPA 111 or an AGC control signal for the second CAPA 112 is generated.

The control gate signal 410 separates the CAPA gate signal 301 into a first CAPA gate signal 302 and a second CAPA gate signal 303, and controls the first signal selection means 47 and the second signal selection means 48 so as to select the first CAPA 111 control path and the second CAPA 112 control path by the first CAPA gate signal 302 and the second CAPA gate signal 303, respectively.

In the control path selected by the control gate signal 410, initially the amplitude information of the analog signal 40 is extracted from the output of the A/D converter 42 by the first amplitude information extraction means 43 or the second amplitude information extraction means 44. Then, the output of the first amplitude information extraction means 43 or the second amplitude information extraction means 44 is selected as an amplitude information output corresponding to the first CAPA 111 and the second CAPA 112, respectively, by the second signal selection means 48 using the control gate signal 410, and the selected signal is input to the AGC control means 45, whereby an AGC control signal is generated.

Next, the output of the AGC control means 45 is converted into a gain signal 210 as an analog signal, i.e., a control signal for the VGA 41, by the D/A converter 46, and the VGA 41 is controlled with this gain signal 210. As a result, the input analog signal 40 having the reproduction waveform B 105 in which the amplitudes of the first CAPA 111 and the second CAPA 112 are not uniform is controlled so as to have the reproduction waveform 201 shown in FIG. 8 in which the amplitudes of the first CAPA 211 and the second CAPA 212 are uniform.

According to the fourth embodiment of the invention, after increasing the amplitude of the input analog signal 40 having the ID sections indicating the plural pieces of address information and the DATA sections indicating the user information, the analog signal 40 is digitized, and plural pieces of amplitude information are extracted from the signals corresponding to the plural pieces of address information included in the ID sections, and thereafter, the gain of the VGA 41 is controlled on the basis of the respective amplitude information extracted. Therefore, automatic gain control can be performed for only the ID sections in accordance with the respective characteristics of the plural pieces of address information included in the ID sections. As a result, the automatic gain control can be carried out more accurately, and the error rate in reading the address information can be reduced, thereby realizing a stable system constitution.

Furthermore, since, in this fourth embodiment, the gain control for the VGA is carried out on the basis of the respective gains of the first CAPA 111 and the second CAPA 112 in the ID section 110 of the input signal 40, the first CAPA and the second CAPA can be independently AGC-controlled with higher accuracy, whereby performance of automatic gain control can be further enhanced. Further, since the automatic gain control device according to this fourth embodiment employs one AGC control means while the device according to the third embodiment employs two AGC control means, the circuit scale can be reduced.

[Embodiment 5]

Hereinafter, an automatic gain control device and an automatic gain control method according to a fifth embodiment of the present invention will be described with reference to FIGS. 5, 6, 7, and 8. Since FIGS. 6 to 8 have already been described for the first embodiment, repeated description is not necessary.

Figure 5:
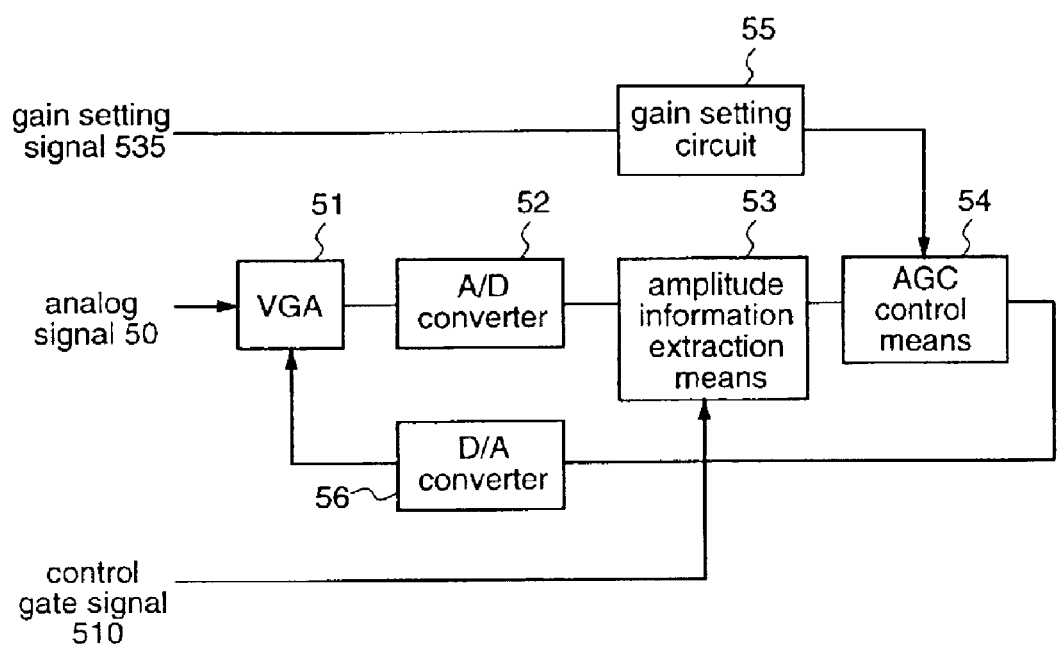
FIG. 5 is a block diagram illustrating the construction of an automatic gain control device according to a fifth embodiment of the present invention.

FIG. 5 is a block diagram illustrating the construction of the automatic gain control device according to the fifth embodiment.

In FIG. 5, reference numeral 50 denotes an analog signal reproduced from a storage medium, and this analog signal 50 has ID sections indicating plural pieces of address information having different characteristics, and DATA sections indicating user information. Reference numeral 51 denotes a VGA (Variable Gain Amplifier) for increasing the amplitude of the analog signal 50 with gains according to the respective characteristics of the plural pieces of address information included in the ID sections. Reference numeral 52 denotes an A/D converter for converting the output from the VGA 51, which is an analog signal, into a digital signal by sampling the analog signal. Reference numeral 53 denotes an amplitude information extraction means for extracting amplitude information from the reproduced signal that has been converted into the digital signal (the output of the A/D converter 52). Reference numeral 54 denotes an AGC control means for controlling the amplitude of the input analog signal 50 on the basis of the amplitude information extracted by the amplitude information extraction means 53. Reference numeral 55 denotes a gain setting circuit for performing setting of an arbitrary constant gain for the VGA 51, or performing setting for AGC control. Reference numeral 56 denotes a D/A converter for converting the digital signal outputted from the AGC control means 54 into an analog signal. Reference numeral 510 denotes a control gate signal for discriminating between the first CAPA and the second CAPA. The control gate signal 510 is generated in the same manner as the control gate signal of the first embodiment. Reference numeral 535 denotes a gain setting signal for setting a state on the gain setting circuit 55.

Hereinafter, a description will be given of the operation of the automatic gain control device constructed as described above.

The analog signal 50 is in a form of the reproduction waveform A 100 (reproduction waveform B 105) shown in FIG. 6 (FIG. 7), and it is input to the VGA 51. At this time, in the reproduction waveform B 105 shown in FIG. 7, the amplitudes of the first CAPA 111 and the second CAPA 112 are different from each other, and are nonuniform.

The analog signal whose amplitude is increased by the VGA 51 is converted into a digital signal by the A/D converter 52. Then, the amplitude information extraction means 53 extracts amplitude information of the input analog signal 50 from the output of the A/D converter 52, and supplies the extracted amplitude information to the AGC control means 54.

On the other hand, the gain setting circuit 55 selects either the first control mode for performing AGC control or the second control mode for setting the gain of the VGA 51 at an arbitrary constant value, on the basis of the gain setting signal 535.

When the first control mode is selected, the AGC control means 54 controls the gain of the AGC on the basis of the output from the amplitude information extraction means 53, and outputs the amount of control to the D/A converter 56. On the other hand, when the second control mode is selected, the AGC control means 54 controls its output so as to have an arbitrary constant gain, and outputs the amount of control to the D/A converter 56.

The D/A converter 56 converts the output of the AGC control means 54 (digital signal) into a gain signal 115 (an analog signal), and the VGA 51 is controlled with the gain signal 115. As a result, the input analog signal 50 having the reproduction waveform B 105 in which the amplitudes of the first CAPA 111 and the second CAPA 112 are not uniform is controlled so as to have the reproduction waveform 201 shown in FIG. 8 in which the amplitudes of the first CAPA 211 and the second CAPA 212 are uniform. Thus, the absolute value of the input signal can be detected by setting the constant gain on the VGA 51.

According to the fifth embodiment of the present invention, after increasing the amplitude of the input analog signal 50 having the ID sections indicating the plural pieces of address information and the DATA sections indicating the user information, the analog signal is digitized, and plural pieces of amplitude information are extracted from the signals corresponding to the plural pieces of address information included in the ID sections in the digitized signal, and thereafter, the gain of the VGA 51 is controlled on the basis of the respective amplitude information extracted. Therefore, automatic gain control can be performed for only the ID sections in accordance with the respective characteristics of the plural pieces of address information included in the ID sections. As a result, the automatic gain control can be carried out more accurately, and the error rate in reading the address information can be reduced, resulting in a stable system constitution.

Furthermore, in this fifth embodiment, the gain control for the VGA 51 is carried out on the basis of the predetermined gain level based on the gain setting signal 535, the automatic gain control can be carried out on the basis of the set gain level. As a result, the address reading rate is increased, resulting in a small-scale and inexpensive automatic gain control device.

What is claimed is:

1. An automatic gain control device for automatically controlling an amplitude of an analog signal to be constant when reproducing the analog signal which has ID sections indicating plural pieces of address information having different characteristics, and DATA sections indicating user information, said device comprising:

a variable gain amplifier means for generating an output comprising an amplified analog signal having an amplitude increased by a predetermined gain;

an A/D conversion means for sampling the output of the variable gain amplifier means to convert said output into a digital signal;

a first amplitude information extraction means for extracting amplitude information from signals corresponding to the plural pieces of address information in such digital signal; and a first automatic gain control means for controlling the gain of the variable gain amplifier means on the basis of the respective amplitude information extracted by the first amplitude information extraction means.

2. The automatic gain control device as defined in claim 1 further comprising:

a gain ratio generation means for, when an ID section indicating first address information among the plural pieces of address information included in the ID sections is a first CAPA and an ID section indicating a next address information is a second CAPA, determining a gain of the second CAPA to have a predetermined constant ratio to a gain of the first CAPA; and a signal selection means for selecting either an output of the first amplitude information extraction means or an output of the gain ratio generation means on the basis of an externally supplied control gate signal, and outputting the selected signal to the first automatic gain control means;

wherein said first automatic gain control means is for controlling the gain of the variable gain amplifier means on the basis of a signal selected by the signal selection means.

3. The automatic gain control device as defined in claim 1, further comprising:

a second amplitude information extraction means having the same construction as the first amplitude extraction means;

a second automatic gain control means having the same construction as the first automatic gain control means; and a signal selection means for outputting the digital signal output of the A/D conversion means to either the first amplitude information extraction means or the second amplitude information extraction means on the basis of an externally supplied control gate signal;

wherein an ID section indicating first address information among the plural pieces of address information included in the ID section is a first CAPA, and an ID section indicating next address information is a second CAPA;

said first amplitude information extraction means for extracting first amplitude information from the first CAPA and outputting said first information to the first automatic gain control means, and the first automatic gain control means for controlling the gain of the variable gain amplifier means on the basis of the first amplitude information; and said second amplitude information extraction means for extracting second amplitude information from the second CAPA and outputting said second information to the second automatic gain control means, and the second automatic gain control means for controlling the gain of the variable gain amplifier means on the basis of the second amplitude information.

4. The automatic gain control device as defined in claim 1, further comprising:

a second amplitude information extraction means having the same construction as the first amplitude extraction means;

a first signal selection means for outputting the digital signal output of the A/D conversion means to either the first amplitude extraction means or the second amplitude extraction means on the basis of an externally supplied control gate signal; and a second signal selection means for selecting either the output of the first amplitude information extraction means or the output of the second amplitude information extraction means on the basis of an externally supplied control gate signal, and outputting the selected signal to the first automatic gain control means;

wherein an ID section indicating first address information among the plural pieces of address information included in the ID section is a first CAPA and an ID section indicating next address information is a second CAPA;

said first amplitude information extraction means for extracting first amplitude information from the first CAPA;

said second amplitude information extraction means for extracting second amplitude information from the second CAPA; and said automatic gain control means for controlling the gain of the variable gain amplifier means on the basis of amplitude information selected by the second signal selection means.

5. An automatic gain control device as defined in claim 1, further comprising:

a gain setting means for setting a predetermined gain level;

wherein said first automatic gain control means controls the gain of the variable gain amplifier means on the basis of output from the gain setting means.

6. An automatic gain control device as defined in claim 1, further comprising:

a signal discrimination means for detecting a signal length of the digital signal;

wherein said first amplitude information extraction means is for extracting amplitude information from a signal of a desired signal length in the digital signal on the basis of the signal length detected by the signal discrimination means, and is for outputting the extracted amplitude information to the automatic gain control means.

7. The automatic gain control device as defined in claim 6, wherein said first automatic gain control means is for controlling the gain of the variable gain amplifier means so that an amplitude of the signal having a desired signal length becomes constant.

8. The automatic gain control device as defined in claim 6, wherein said first automatic gain control means is for controlling the gain of the variable gain amplifier means so that an amplitude of a signal having a signal length determined over three time intervals becomes constant.

9. The automatic gain control device as defined in claim 6, wherein said first automatic gain control means is for controlling the gain of the variable gain amplifier means so that an amplitude of one of signals having signal lengths of at least four time intervals becomes constant.

10. The automatic gain control device as defined in claim 6, wherein said first automatic gain control means is for controlling the gain of the variable gain amplifier means so that the amplitudes of signals become constant.

11. An automatic gain control method for automatically controlling a gain of a variable gain amplifier when increasing an amplitude of a reproduction signal which has ID sections indicating plural pieces of address information having different characteristics and DATA sections indicating user information by using the variable gain amplifier, said method comprising:

extracting amplitude information from signals corresponding to plural pieces of address information included in the ID sections of a reproduction signal; and automatically controlling the gain of a variable gain amplifier in accordance with characteristics of the extracted amplitude information.

12. The automatic gain control method as defined in claim 11, wherein an ID section indicating first address information among the plural pieces of address information included in the ID sections is a first CAPA, and an ID section indicating the next address information is a second CAPA, and the gain of the second CAPA is determined to have a predetermined constant ratio to the gain of the first CAPA; and the gain of the first CAPA and the gain of the second CAPA are switched on the basis of an externally supplied control gate signal, thereby automatically controlling the gain of the variable gain amplifier.

13. The automatic gain control method as defined in claim 11, wherein an ID section indicating first address information among the plural pieces of address information included in the ID sections is a first CAPA, and an ID section indicating next address information is a second CAPA; and either a first automatic gain control for controlling the gain of the variable gain amplifier by extracting first amplitude information from the first CAPA or a second automatic gain control for controlling the gain of the variable gain amplifier by extracting second amplitude information from the second CAPA is carried out on the basis of an externally supplied control gate signal.

14. The automatic gain control method as defined in claim 11, wherein a predetermined gain level is set, and the gain of the variable gain amplifier is automatically controlled on the basis of the set gain.

15. The automatic gain control method as defined in claim 11, wherein a signal length of a reproduction signal is detected; and amplitude information of a signal having a desired signal length is extracted from the reproduction signal on the basis of the detected signal length, thereby automatically controlling the gain of the variable gain amplifier.

* * * * *